US008558635B2

(12) United States Patent
Jeong et al.

(10) Patent No.: US 8,558,635 B2
(45) Date of Patent: Oct. 15, 2013

(54) 3-WAY BALUN FOR PLANAR-TYPE DOUBLE BALANCED MIXER

(75) Inventors: Jin-Cheol Jeong, Daejon (KR); In-Bok Yom, Daejon (KR); Dong-Pil Chang, Daejon (KR); Inkwon Ju, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 340 days.

(21) Appl. No.: 13/130,197

(22) PCT Filed: Jul. 30, 2009

(86) PCT No.: PCT/KR2009/004259

§ 371 (c)(1), (2), (4) Date: May 19, 2011

(87) PCT Pub. No.: WO2010/058892

PCT Pub. Date: May 27, 2010

(65) Prior Publication Data

US 2011/0227663 A1 Sep. 22, 2011

(30) Foreign Application Priority Data

Nov. 19, 2008 (KR) ........................ 10-2008-0115287

(51) Int. Cl.
*H03H 5/00* (2006.01)
*H01P 3/08* (2006.01)

(52) U.S. Cl.
USPC ............................................ 333/25; 333/238

(58) Field of Classification Search
USPC ............................................ 333/25, 26, 238
See application file for complete search history.

(56) References Cited

U.S. PATENT DOCUMENTS 7,468,640 B2 * 12/2008 Nosaka ........................... 333/26
7,856,222 B2 * 12/2010 Vieira et al. .................. 455/326
8,064,871 B2 * 11/2011 Kuo et al. ..................... 455/326
8,076,996 B2 * 12/2011 Lee et al. ..................... 333/117
8,279,018 B1 * 10/2012 Song et al. ..................... 333/25
2004/0061581 A1 4/2004 Park et al.
2004/0185816 A1 9/2004 Ji
2006/0001502 A1 1/2006 Tabatchnick et al.
2006/0279374 A1 12/2006 Wu et al.

FOREIGN PATENT DOCUMENTS

EP 0464608 A1 1/1992
JP H09-083254 A 3/1997
JP 2008-219081 A 9/2008
KR 2001-0010897 A 2/2001
KR 2004-0015543 A 2/2004

OTHER PUBLICATIONS

Yoke Choy Leong et al., "A Derivation of a Class of 3-Port Baluns from Symmetrical 4-Port Networks", 2002 IEEE MTT-S Digest, Aug. 7, 2002, pp. 1165-1168.

* cited by examiner

*Primary Examiner* — Dean O Takaoka
(74) *Attorney, Agent, or Firm* — Rabin & Berdo, P.C.

(57) ABSTRACT

Provided is a 3-way balun for a double balanced mixer. This research provides a 3-way balun available for a planar-type double balanced mixer and a planar-type double balanced mixer employing the same. The 3-way balun includes a first output unit for receiving and outputting an input signal of a predetermined frequency; and second and third output units connected to the first output unit and outputting signals whose phase is different by 180 from a phase of a signal of the first output unit and amplitude is a half of an amplitude of the signal outputted from the first output unit.

8 Claims, 3 Drawing Sheets

3-WAY BALUN FOR PLANAR-TYPE DOUBLE BALANCED MIXER

TECHNICAL FIELD

The present invention relates to a balun needed to design a double balanced mixer.

The present invention claims priority of Korean Patent Application No. 10-2008-0115287, filed on Nov. 19, 2008, which are incorporated herein by reference.

BACKGROUND ART

Balanced mixers generally have many advantages in wireless communication systems and they are applied to diverse fields. In the first place, balanced mixers have an excellent isolation property between ports of a radio frequency (RF) unit and a local oscillator (LO). Secondly, balanced mixers have a wideband characteristic. Thirdly, they have a wide dynamic range These advantages have made the balanced mixers applicable to diverse RF systems. Herein, the isolation property is one of important factors for assessing the performance of a mixer. Isolation signifies the extent of isolating two certain objects. Generally, isolation mentioned in a wireless system is a parameter indicating the extent of prohibiting interference caused in an adjacent port to a port of an input signal or an output signal from affecting another port.

Isolation will be described in detail hereafter by taking an example of a wireless communication system employing a widely used superheterodyne scheme. In a super-heterodyne wireless communication system, RF signals are converted into intermediate frequency (IF) signals by using signals generated in a local oscillator. Thus, the super-heterodyne wireless communication system uses a mixer having three ports: one for IF signals, one for signals from local oscillator, and one for RF signals. Since the mixer is a device for frequency conversion, the isolation among the three ports becomes a particularly important parameter.

Balanced mixers include single balanced mixers and double balanced mixers. The single balanced mixers have a structure of isolating two frequency input units that are considered to have an isolation problem by using a coupler or a transformer. The two frequency input units are generally a port for RF signals and a port for signals from a local oscillator. In other words, when the two inputs are distinguished by using a coupler or a transformer, signals transmitted to a counterpart becomes minimized although signals are simultaneously inputted from both units. Herein, the coupler may be a 90 hybrid coupler or a coupler giving one part a 180° phase difference.

Double balanced mixers are devised to enhance the isolation more than the single balanced mixers. In short, the double balanced mixers have a structure connecting all input output units by a balun to completely isolate all ports one from anther. A balun is an apparatus for dividing one input signal into two signals having the same signal amplitude and a phase difference of 180° from each other. A structure of a double balanced mixer will be described hereafter.

Generally, a balun having excellent characteristic is designed in a distribution type, which has a shape of microstrip. A representative balun having the microstrip-shaped distribution type is a Marchand balun. A Marchand balun includes two coupled lines each having a length of ¼ wavelength (λ) and using a medium part of a connection line with its both ends grounded as a load so as to realize a wideband balun. The frequency band of a Marchand balun is known to range to a frequency twice the initial frequency, which is 1 octave.

A disadvantage of the Marchand balun is that the positions of ports are not flexible. This is because since the medium part of the connection line with two output ports is used, the two output ports are positioned close to each other. Thus, it may be advantageous to use a Marchand balun in a double balanced mixer if the double balanced mixer has a special structure where output ports are gathered in a star shape. However, if the double balanced mixer has a structure where the output ports are apart from each other, it is difficult to apply the Marchand balun to the double balanced mixer.

To overcome the problem, Y. C. Leong suggested a balun of a modified form in a paper entitled "A Derivation of a Class of 3-Port Baluns from Symmetrical 4-Port Networks," *IEEE MTT-s Digest,* 2002, pp. 1165-1168. Y. C. Leong proposed a balun positioned in the medium part of a connection line with ¼ wavelength and having a structure where both ends of an input port are grounded and two outputs are disposed at both ends of the connection line. With the balun structure proposed by Leong, sufficient space can be acquired between the two output ports. Thus, positional flexibility is acquired even in a structure where output ports are positioned apart from each other.

Hereafter, the double balanced mixer described above will be described in detail with reference to the accompanying drawings.

FIG. 1 illustrates a typical double balanced diode mixer employing a two-way balun with an LO balun and an RF balun.

The typical double balanced diode mixer includes three ports. One is an input port 102 of an RF balun 105, and another is an input port 103 of the LO balun 106. The other is an IF output port 104. The output of the LO balun 106 is outputted through two ports. Also, a diode unit 101 includes four diodes D1, D2, D3 and D4 in a structure where the anodes and cathodes are connected to each other in a ring shape. One output port of the LO balun 106 is connected to an anode of the diodes having a ring shape, and the other output port is connected to an anode of an opposite diode of the diodes having a ring shape. Also, to have a look at how the LO balun 106 is connected in FIG. 1, one output port of LO balun 106 is connected to an anode of a first diode D1 and another input is connected to an anode of a third diode D3.

The RF balun 105 also includes two output ports. One output port is connected to an anode of another diode which is not connected to the LO balun 106 among the diodes of the ring shape, and the other output port is connected to an anode of an opposite diode. Referring to FIG. 1, one output port of the RF balun 105 is connected to an anode of a second diode D2 whereas the other output port is connected to an anode of a fourth diode D4. The anode of the fourth diode D4 is connected to the anode of the second diode D2 by two inductors L1 and L2, and an IF output port is connected between the two inductors L1 and L2.

The double balanced mixer having the above-described structure includes the RF balun 105, the LO balun 106, and a branch-shaped diode ring. The RF balun 105 and the LO balun 106 are formed in the RF port 102 and the LO port 103 to output signals having a phase difference of 180° from each other. Therefore, signals with a phase difference of 180° are inputted to each diode pair. In short, the two outputs of the double balanced mixer are signals having the same amplitude and a phase difference of 180° to each other.

The double balanced mixer shown in FIG. 1 has an overlapping section 107 where lines are overlapped. According to the characteristics of a balun and a double balanced mixer, a typical double balanced mixer has a part where one of the output lines of the LO balun 106 is overlapped with one of the output lines of the RF balun 105 at one point. When the two signal lines are overlapped at one point, a short is avoided by using a two-layer substrate or a jump line. When a board-type circuit is designed and signal lines are overlapped, an additional process of fabricating a two-layer substrate or a jump line is needed to avoid a short, and this increases the production costs. Also, the overlapped part where the two lines are superposed may cause an RF parasitic effect in the double balanced mixer. When the RF parasitic effect occurs, the characteristics of the balun are deteriorated to thereby degrade the overall characteristics of the double balanced mixer. FIG. 1 also shows another overlapping section in the signal line connected to the IF output port 104. However, as the frequency of IF signals are generally very low compared to RF or LO signals, the overlapping in the signal line connected to the IF output port 104 does not affect the RF characteristics greatly.

FIG. 2 illustrates a structure of a two-way balun disclosed in the reference literature. The two-way balun shown in FIG. 2 has a structure obtained by modifying part of a general wideband Marchand balun.

A third plane (P3) connected to an input port 201 has a length of ¼λ and the other end of the third plane (P3) is grounded. In FIG. 2, although the ground is given only one reference numeral, the grounds are the same. In case of a planar substrate, the ground is realized in the form of a via hole. A first plane (P1) having the same size as the third plane (P3) have its both ends grounded, and the first plane (P1) and the third plane (P3) are disposed in a row. A second plane (P2) disposed in parallel to the first plane (P1) and a fourth plane (P4) disposed in parallel to the third plane (P3) are connected in the shortest way. The other end of the second plane (P2) is a second output port (Out2), and the other end of the fourth plane (P4) is a first output port (Out1).

Signals outputted from the first output port (Out1) and the second output port (Out2) have the same amplitude and the opposite phase. A wideband balun is generally realized using coupled lines and an odd mode impedance and an even mode impedance become significant values deciding the characteristics of the balun in the designing of the balun. In the balun having the structure of FIG. 2, a conventional technology decides the odd mode impedance and the even mode impedance as expressed in Equation 1.

$$Z_{oo} = \frac{-\sqrt{Z_o^2} + Z_o\sqrt{2Z_o^2 + Z_sZ_L}}{\sqrt{Z_sZ_L}},\ Z_{oe} = \frac{Z_o^2}{Z_{oo}} \quad \text{Eq. 1}$$

where $Z_S$ denotes impedance of a signal source; $Z_L$ denotes impedance of a load; $Z_o$ denotes a characteristic impedance of a coupled line; $Z_{oo}$ denotes an odd mode impedance; and $Z_{oe}$ denotes an even mode impedance.

The balun shown in FIG. 2 is eventually a two-way balun, and as described above, a two-way balun should have a circuit structure shown in FIG. 1. Therefore, the overlapping section where an output line of the LO balun and an output line of the RF balun are overlapped is induced. When the line overlapping section is caused, the problem associated with FIG. 1 cannot be resolved.

DISCLOSURE OF INVENTION

Technical Problem

An embodiment of the present invention is directed to providing a planar-type double balanced mixer that can prevent degradation of radio frequency characteristics caused by a parasitic effect caused by an overlapping part between two baluns.

Another embodiment of the present invention is directed to providing a planar-type double balanced mixer that can cut down on a production cost.

Another embodiment of the present invention is directed to providing a double balanced mixer that can cut down on a production cost.

Another embodiment of the present invention is directed to providing a balun device for a planar-type double balanced mixer.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided a 3-way balun, including: a first output unit for receiving and outputting an input signal of a predetermined frequency; and second and third output units connected to the first output unit, and outputting signals whose phase is different by 180° from a phase of a signal of the first output unit and magnitude is a half of a magnitude of the signal outputted from the first output unit.

In accordance with another aspect of the present invention, there is provided a 3-way balun for a double balanced mixer, the 3-way balun including: a first balun for receiving a first frequency signal and outputting two signals having a phase difference of 180° from each other; a second balun including second and third output ports for receiving a second frequency signal and outputting signals having the same phase and amplitude as the second frequency signal, and a first output port having an amplitude twice as strong as the signal outputted from the second output port and a phase difference of 180° from the signal outputted from the second output port; first and second coils connected between output ports of the first balun; two diodes connected in series from the second output port of the second balun to the first output port of the second balun; two diodes connected in series from the first output port of the second balun to the third output port of the second balun, wherein one output port of the first balun is connected to a contact point of the diodes serially connected to the first and second output ports of the second balun, and the other output port of the first balun is connected to a contact point of the diodes serially connected to the first and third output ports of the second balun, and an output port is connected to the first and second coils.

Advantageous Effects

With the 3-way balun of the present invention, the overlapping section where outputs of two baluns are overlapped is not induced and thus RF parasitic effect can be eliminated. Also, the 3-way balun of the present invention can make remove an additional process step such as an air-bridge and a jumping line realized in a planar shape, the production process is simplified and the production cost can be reduced.

BEST MODE FOR CARRYING OUT THE INVENTION

The advantages, features and aspects of the invention will become apparent from the following description of the embodiments with reference to the accompanying drawings, which is set forth hereinafter. Also, when it is considered that detailed description on a related art may obscure a point of the present invention, the description will not be provided herein.

In the first place, terms used in the present specification will be described. A 3-way balun signifies a balun with one input port and three output ports. A 2-way balun signifies a typical balun with one input port and two output ports. A planar-type means a circuit formed by using a plane-shaped circuit board.

The present invention provides a planar-type double balanced mixer that can cut off the possibility of an RF parasitic effect from the very source and reduce production cost by simplifying a production process. For the planar-type double balanced mixer, the present invention suggests a balun of a new structure not overlapped with another balun. In other words, when a double balanced mixer is realized, one between an LO balun and an RF balun is designed to be a 3-way balun and the other is designed to be a 2-way balun. With this design, the output lines of the baluns are not structurally overlapped. In a general double balanced mixer, diodes are disposed in a ring shape. However, when the 3-way balun of the present invention is used, four diodes are disposed not in a circular shape but in a straight line shape.

Figure 3:
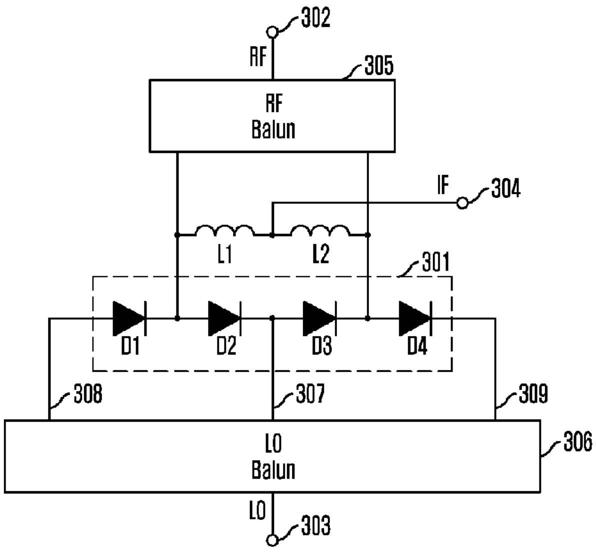
FIG. 3 is a circuit diagram of a planar-type double balanced mixer in accordance with an embodiment of the present invention.

FIG. 3 is a circuit diagram of a planar-type double balanced mixer in accordance with an embodiment of the present invention.

To describe an operation of the planar-type double balanced mixer, an RF signal is inputted to an RF balun 305 through an RF input port 302 for receiving RF signals. The RF balun 305 outputs a signal through two output lines. Also, an LO signal is inputted to an LO balun 306 through an LO input port 303 for receiving LO signals. The LO balun 306 outputs a signal through three output lines. A specific structure of the LO balun 306 will be described later in detail with reference to the accompanying drawings.

According to an embodiment of the present invention, the LO balun 306 includes a first output port 307, a second output port 308, and a third output port 309. An output of the second output port 308 is connected to an anode of a first diode (D1). A cathode of the first diode (D1) is connected to an anode of the second diode (D2), and a cathode of the second diode (D2) is connected to an anode of the third diode (D3).

A cathode of the third diode (D3) is connected to an anode of the fourth diode (D4), and a cathode of the fourth diode (D4) is connected to the third output port 309 of the LO balun 306. Such connection of the four diodes is called a serial connection of diodes. According to a related art, the four diodes are connected in a circular shape. However, the four diodes are connected in series according to the present invention. Therefore, the present invention does not cause an RF balun and an LO balun to be overlapped.

The first output port 307 of the LO balun 306 is disposed between the cathode of the second diode (D2) and the anode of the third diode (D3). Also, an output port of the RF balun 305 is connected between the first diode (D1) and the second diode (D2), and another output port of the RF balun 305 is connected between the third diode (D3) and the fourth diode (D4). In addition, two inductors (L1 and L2) are connected between one output port of the RF balun 305 and another output port. An Intermediate Frequency (IF) output port 304 is connected between the inductors (L1 and L2).

The above embodiment illustrates the LO balun 306 with three output ports and the RF balun 305 with two output ports. If necessary, the RF balun 305 may be designed to have three output ports and the LO balun 306 may be designed to have two output ports.

Figure 4:
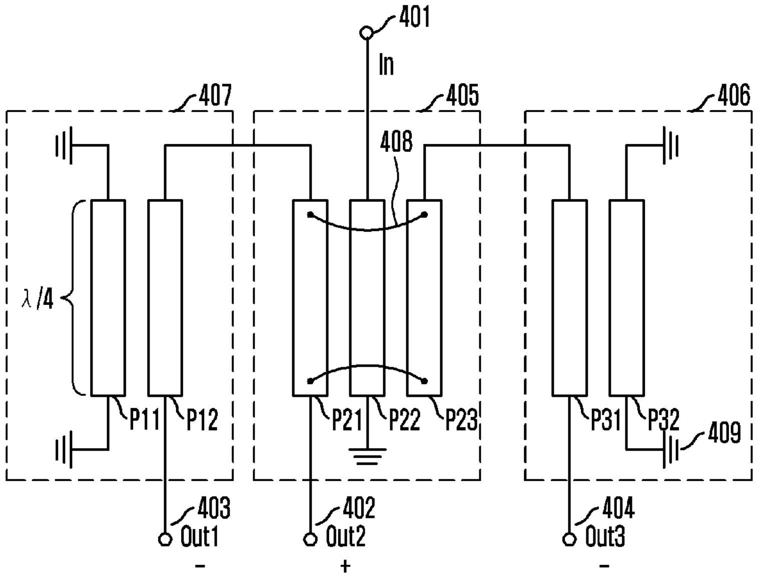
FIG. 4 illustrates a 3-way balun in accordance with an embodiment of the present invention.

FIG. 4 illustrates a 3-way balun in accordance with an embodiment of the present invention. Hereafter, a structure of a 3-way balun will be described in accordance with a specific embodiment of the present invention.

The 3-way balun includes a second output unit 405, a first output unit 407, and a third output unit 406. Three planes having a length of ¼ wavelength are disposed in parallel in the second output unit 405. Among the three planes, one end of a plane P22 disposed in the middle is connected to an input port 401, and the other end is grounded. One end of a plane P21 disposed on the left is connected to the first output unit 407, and the other end is connected to a second output port 402. One end of a plane P23 disposed on the right is connected to a third output unit 406. The left plane (P21) and the right plane (P23) of the second output unit 405 are connected to each other as shown in 408.

In the first output unit 407, two planes having a length of ¼ wavelength are disposed in parallel in the same direction as the second output unit 405. One end of a right plane (P12) is connected to the second output unit 405, and the other end is connected to a first output port 403. Both ends of a left plane (P11) are grounded.

In the third output unit 406, two planes having a length of ¼ wavelength are disposed in parallel in the same direction as the second output unit 405. One end of a left plane (P31) is connected to the second output unit 405, and the other end is connected to the third output port 404. Both ends of a left plane (P32) are grounded.

The structure shown in FIG. 4 is a shape obtained by adding a coupled line of a length of /4 to the typical balun described above. The 3-way balun according to an embodiment of the present invention includes one input port 401 and three output ports 402, 403 and 404. Also, signals outputted to the respective output ports have the following characteristics.

First, the output signals of the first output port 403 and the third output port 404 should have the same amplitude and phase.

Second, the output signal of the second output port 402 should have twice as strong amplitude as the output signals of the first output port 403 and the third output port 404.

Third, the output signal of the second output port 402 should have an opposite phase to the output signals of the first output port 403 and the third output port 404, that is, the phase difference should be 180°.

An input impedance of the balun input port 401 is generally 50 ohms and a load impedance of the second output port 402 is also generally 50 ohms. However, the load impedance connected to the first output port 403 and the third output port 404 should be twice as strong as that of the second output port 402. Therefore, the load impedances connected to the first output port 403 and the third output port 404 are 100 ohms, respectively.

The second output unit 405 is a coupled line on the part of the input port and it has an odd mode impedance and an even mode impedance as expressed in the following Equation 2.

$$Z_{oo1} = \frac{-\sqrt{2}Z_o^2 + Z_o\sqrt{2Z_o^2 + Z_S Z_L}}{\sqrt{Z_S Z_L}} \qquad \text{Eq. 2}$$

$$Z_{oe1} = \frac{Z_o^2}{Z_{oo1}}$$

where $Z_S$ denotes impedance of a signal source; $Z_L$ denotes impedance of a load; $Z_o$ denotes a characteristic impedance of a coupled line; $Z_{oo1}$ denotes an odd mode impedance of a coupled line of the second output unit 405; and $Z_{oe1}$ denotes an even mode impedance of a coupled line of the second output unit 405.

The first output unit 407 and the third output unit 406 are coupled lines on the part of an output unit and they have an odd mode impedance and an even mode impedance shown in the following Equation 3.

$$Z_{oo2}=2Z_{oo1}$$

$$Z_{oe2}=2Z_{oe1} \qquad \text{Eq. 3}$$

where $Z_{oo2}$ denotes an odd mode impedance of a coupled line between the first output unit 407 and the third output unit 406, whereas $Z_{oe2}$ denotes an even mode impedance of a coupled line between the first output unit 407 and the third output unit 406.

Referring to FIG. 4, a reference numeral 408 denotes a jump line, which connects coupled lines when a plurality of coupled lines are used to raise an even mode impedance. The jump line is realized as wire boning or an airbridge. A reference numeral 409 denotes a ground point. All the five ground points shown in FIG. 4 are the same.

Figure 5:
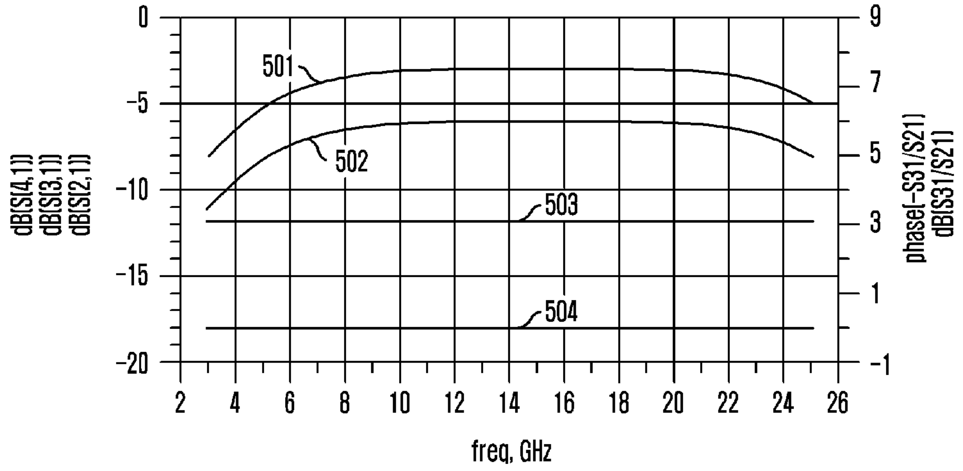
FIG. 5 is a graph showing a simulation result on the characteristics of a 3-way balun with an ideal coupled line.

FIG. 5 is a graph showing a simulation result on the characteristics of a 3-way balun with an ideal coupled line. The graph of FIG. 5 is a result of a simulation modeling an aforementioned ideal coupled line having two impedance values described in Eq. 2 and Eq. 3.

In FIG. 5, a first graph line 501 shows an amplitude ratio of an output signal of the second output port 402 to a signal received in the input port 401. A second graph line 502 shows an amplitude ratio of an output signal of the first output port 403 or the third output port 404 to a signal received in the input port 401. A ratio of output signals can be calculated from the first and second graph lines 501 and 502 as shown in a third graph line 503.

The third graph line 503 shows that the signal amplitude of the second output port 402 is exactly twice as strong as the amplitude of the output signal of the first output port 403 and the third output port 404 in all bands, that is, 3 dB. Also, the phase of a signal is represented by the fourth graph line 504. The fourth graph line 504 of FIG. 5 shows a calculated phase ratio (−S31/S21).

Since the phase ratio (−S31/S21) becomes exact 0, the phase of the second output port 402 is different by 180 from the phase of the signals of the first output port 403 and the third output port 404. In the drawings, S31 and S(3,1) are the same and they signify the ratio of a signal outputted through a port 3 to a signal inputted through a port 1.

Therefore, (dB(S31) or (dB(S(3,1)) is what expresses an amplitude ratio of an output signal (which is a port 3) to an input signal (which is the port 1) on the basis of dB. Also, phase(S31) or phase(S(3,1)) indicates a phase difference of the output signal (which is the port 3) with respect to the input signal (which is the port 1). The same is applied to S21, S41 and others.

Figure 6:
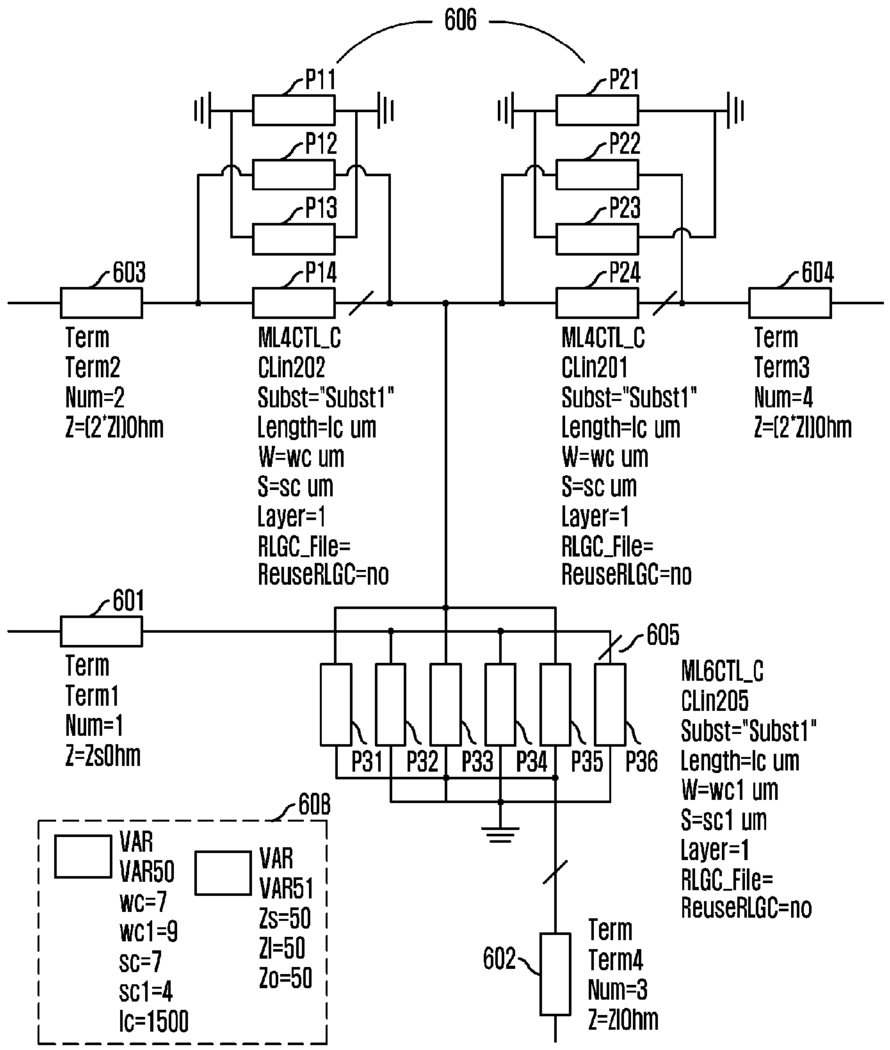
FIG. 6 illustrates an actual structure of a 3-way balun designed to have a coupled line in accordance with another embodiment of the present invention.

FIG. 6 illustrates an actual structure of a 3-way balun designed to have a coupled line in accordance with another embodiment of the present invention.

Conditions for fabricating the balun according to the present invention will be described first. The balun of the present invention is realized on a GaAs substrate having a thickness of 100 m, which is used for the design of a Monolithic Microwave Integrated Circuit (MMIC). Size values of patterns of the balun are all feasible values for manufacturing process.

Figure 1:
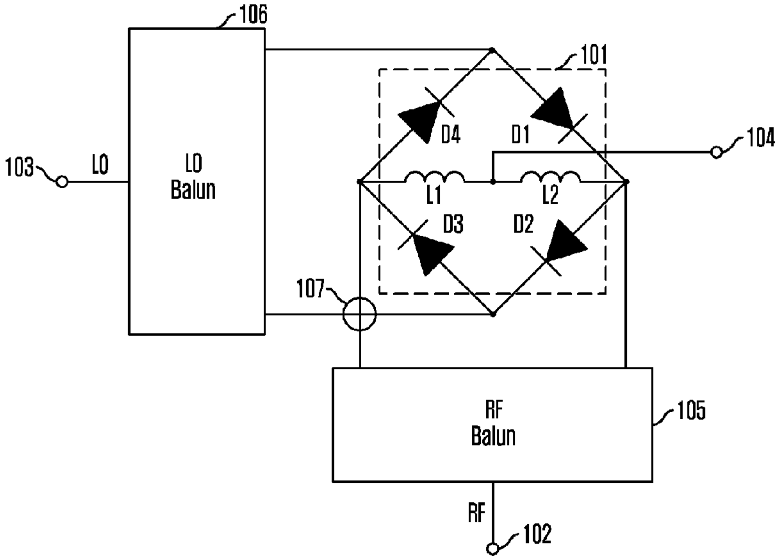
FIG. 1 illustrates a typical double balanced diode mixer employing two-way baluns of an LO balun and an RF balun.
Figure 2:
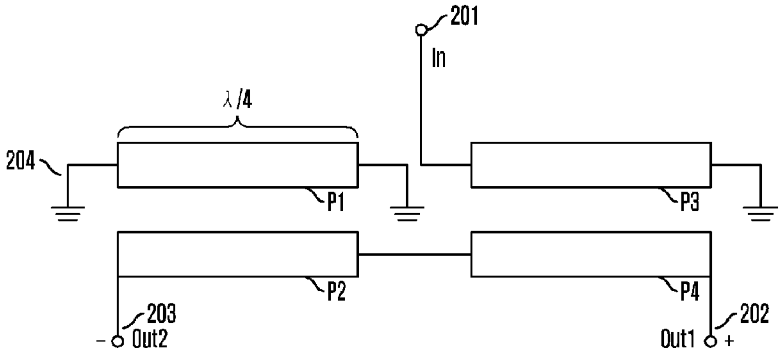
FIG. 2 illustrates a structure of a two-way balun disclosed in a conventional technology.

In FIG. 1, reference numeral 601 is an input port, and reference numeral 602 corresponds to the second output port 402 of FIG. 4. Reference numeral 603 corresponds to the first output port 403, and reference numeral 604 corresponds to the third output port 404.

Reference numeral 605 corresponds to the second output unit 405, and six coupled lines P31, P32, P33, P34, P35 and P36 are realized as coupled lines on the input part. Reference numeral 606 indicates coupled lines on the output part, which correspond to the first output unit 407 and the second output unit 405.

The reference numeral 606 includes four coupled lines for each output unit, that is, it includes coupled lines P11, P12, P13 and P14, which correspond to the first output unit 407, and coupled lines P21, P22, P23 and P24, which correspond to the third output unit 406. Reference numeral 608 indicates variables of the coupled lines and impedances of the source, load, and input lines. The variables of the coupled lines present the width of each coupled line, the space between coupled lines, and the length of each coupled line. The structure shown in FIG. 6 can be all realized as an MMIC, which is already mentioned before, and the values actually presented in the present specification can be used for realization of an MMIC.

Figure 7:
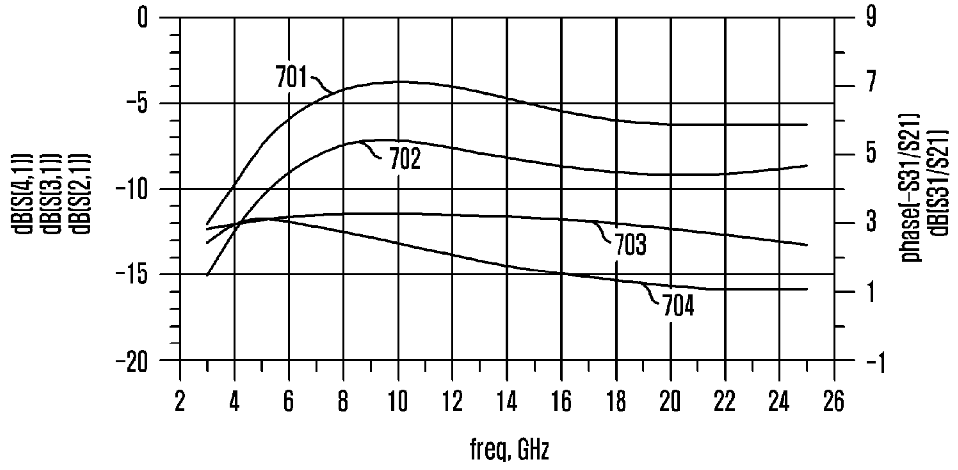
FIG. 7 is a graph showing a simulation result on the characteristics of the 3-way balun designed as shown in FIG. 6.

FIG. 7 is a graph showing a simulation result on the characteristics of the 3-way balun designed as shown in FIG. 6.

Reference numeral 701 is a first graph line showing a ratio of the amplitude of a signal outputted to the second output port 602 to the amplitude of a signal inputted to the input port 601. Reference numeral 702 is a second graph line showing a ratio of the amplitude of a signal outputted to the first output port 603 or the third output port 604 to the amplitude of a signal inputted to the input port 601. FIG. 7 shows simulation results at the frequency range of 6 GHz to 24 GHz. Reference numeral 703 is a third graph line showing simulated signal amplitude imbalance. The third graph line 703 reveals that the amplitude of a signal outputted to the second output port 602 has an amplitude imbalance range of less than ±0.5 dB with respect to the twice amplitude of a signal outputted to the first output port 603 and the third output port 604. Also, reference numeral 704 is a fourth graph line showing a phase imbalance in simulation. The fourth graph line 704 reveals that the phase of a signal outputted to the second output port 602 has a phase imbalance range of less than ±3° with respect to the phase of signals to signals outputted to the first output port 603 and the third output ports 604. This result is similar to or superior to the result obtained by using a general Marchand balun.

The present application contains subject matter related to Korean Patent Application No. 2008-0115287, filed in the Korean Intellectual Property Office on Nov. 19, 2008, the entire contents of which is incorporated herein by reference.

While the present invention has been described with respect to the specific embodiments, it will be apparent to those skilled in the art that various changes and modifications may be made without departing from the spirit and scope of the invention as defined in the following claims.

The invention claimed is:

1. A 3-way balun, comprising:

a first output unit for receiving and outputting an input signal of a predetermined frequency; and second and third output units connected to the first output unit, and outputting signals whose phase is different by 180 from a phase of a signal of the first output unit and amplitude is a half of an amplitude of the signal outputted from the first output unit.

2. The 3-way balun of claim 1, wherein the first output unit includes three planes in parallel to each other, each plane having a length of a ¼ wavelength of an input signal frequency; and a plane disposed in the middle receives a signal at one end while another end is grounded; and the planes disposed on both outer sides have one end connected to the second output unit and the third output unit, respectively, while the planes on both outer sides are connected to each other at an end; and any one plane of the planes disposed on both outer sides has an end opposite to the end where in input signal is received output a signal.

3. The 3-way balun of claim 2, wherein the second and third output units include two planes in parallel to each other, each plane having a length of a ¼ wavelength of an input signal frequency; and a plane far from the first output unit has both ends grounded while a plane close to the first output unit has one end where an input signal is received be connected to the first output unit and has another end output a signal.

4. The 3-way balun of claim 3, wherein an odd mode impedance and an even mode impedance on an output part of the planes of the second and third output units have a half value of an odd mode impedance and an even mode impedance on an output part of the first unit.

5. A doubl balanced mixer using a 3-way balun, comprising:

a first balun for receiving a first frequency signal and outputting two signals having a phase difference of 180 from each other;

a second balun including second and third output ports for receiving a second frequency signal and outputting signals having the same phase and amplitude as the second frequency signal, and a first output port having an amplitude twice as strong as the signal outputted from the second and third output port and a phase difference of 180 from the signal outputted from the second and third output port;

first and second coils connected between output ports of the first balun;

two diodes connected in series from the second output port of the second balun to the first output port of the second balun;

two diodes connected in series from the first output port of the second balun to the third output port of the second balun, wherein one output port of the first balun is connected to a contact point of the diodes serially connected to the first and second output ports of the second balun, and the other output port of the first balun is connected to a contact point of the diodes serially connected to the first and third output ports of the second balun, and an output port is connected to the first and second coils.

6. The 3-way balun of claim 5, wherein a load impedance of the second output port is the same value as an input impedance of an input port receiving the second frequency signal, and the first and third output ports have a value twice as much as the load impedance of the first output port.

7. The 3-way balun of claim 5, wherein the second balun includes a first output port, a second output port, and a third output ports, wherein the first output unit includes three planes in parallel to each other, each plane having a length of a ¼ wavelength of an input signal frequency; and a plane disposed in the middle receives a signal at one end while another end is grounded; and the planes disposed on both outer sides have one end connected to the second output unit and the third output unit, respectively, while the planes on both outer sides are connected to each other at an end; and any one plane of the planes disposed on both outer sides has an end opposite to the end where in input signal is received output a signal, and wherein the second and third output units include two planes in parallel to each other, each plane having a length of a ¼ wavelength of an input signal frequency; and a plane far from the first output unit has both ends grounded while a plane close to the first output unit has one end where an input signal is received be connected to the first output unit and has another end output a signal.

8. The 3-way balun of claim 7, wherein an odd mode impedance and an even mode impedance of a coupled line on an input part have a half value of two odd mode impedances and two even mode impedances on an output part.

* * * * *